United States Patent
Sato et al.

(10) Patent No.: US 6,855,958 B2
(45) Date of Patent: Feb. 15, 2005

(54) WAVELENGTH CONVERSION ELEMENT FOR CAR USE

(75) Inventors: Hiroyuki Sato, Tokyo (JP); Yasushi Yatsuda, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 10/682,697

(22) Filed: Oct. 9, 2003

(65) Prior Publication Data
US 2004/0076016 A1 Apr. 22, 2004

(30) Foreign Application Priority Data
Oct. 16, 2002 (JP) .................................. 2002-301931

(51) Int. Cl.⁷ .............................................. H01L 33/00

(52) U.S. Cl. .......................................... 257/79; 257/99

(58) Field of Search ............................ 257/79, 81, 94, 257/98, 99, 734, 778

(56) References Cited
U.S. PATENT DOCUMENTS
2004/0076016 A1 * 4/2004 Sato et al. .................. 362/555
* cited by examiner Primary Examiner—Mark V. Prenty
(74) Attorney, Agent, or Firm—Carella Byrne Bain Gilfillan Cecchi et al; Elliot M. Olstein; William Squire (57) ABSTRACT

Wavelength conversion element for car use constituted in the following manner can provide practical LED components for headlights and fog lamps. The element comprises a heat conductive base having a cavity; one or more chips fitted to the cavity bottom, and a wavelength conversion part, which converts emitted light from the chip to visible rays, arranged above the chip. The chip comprises a substrate and a light emitting part constituted by an n-type GaN film, an active layer and a p-type GaN film successively laminated on the substrate. The chip has one straight side in its plan view; an angle formed between the bottom and the side cavity surface is over 0 degree and below 90 degree. The cavity has one straight side in its opening. A ratio of the cavity opening to the totaled areas in plan view of the respective chips, is set less than three.

19 Claims, 7 Drawing Sheets

H : Horizontal Line

WAVELENGTH CONVERSION ELEMENT FOR CAR USE

BACKGROUND OF THE INVENTION

1. Field of the Invention

The present invention relates to a wavelength conversion element for car use, which utilizes emitted light wavelengths from a light emitting diode (hereinafter referred as "LED") made of compound semiconductors, particularly for a headlight or the like.

2. Brief Description of the Related Art

An invention disclosed in Japanese laid open patent No.7-99345 is a well known example of wavelength conversion elements.

Figure 12:
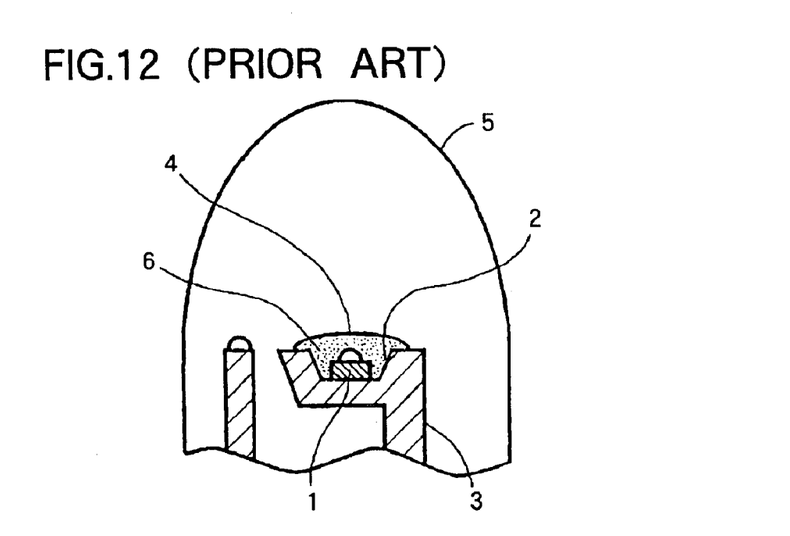
FIG. 12 is a schematic view illustrating a constitution of a conventional LED.

As illustrated in a schematic cross-sectional view in FIG. 12, an emitting chip 1 of an LED constituted by compound semiconductors is mounted on a cup 2 of a lead frame 3. The LED is sealed by a combination of two resins, the first one is a resin 4 which fills the inside of the cup 2 and the second one is a resin 5 which surrounds the resin 4. A fluorescent material which converts emitted wavelengths from chip 1 into other wavelengths or a wavelength conversion material 6 such as a filter material which absorbs a part of emitted wavelengths is included in the first resin 4, so that luminance and light converging efficiency of the LED are enhanced as being reflected the converted wavelengths by the inner surface of the cup 2.

If the wavelength conversion element for car use by the present invention is employed as a light source of a light assembly of a car, the LED having a high luminous emittance (lm/mm$^2$), which determines a required size of an optical portion of the lamp, is desirable. In other words, it is necessary to concentrate luminous flux from the LED on an area as small as possible. However, in a conventional white LED, since excitation light irradiated from the side surface of the chip, an area where there is a fluorescent material corresponds to a light emitting part, namely, the same area as a reflective horn corresponds to the light emitting plane. Consequently, the light emitting part of the LED is large compared with a projected chip area on a plane perpendicular to an optical axis of the LED. In other words the luminous emittance of the LED is lowered to an extent incapable of being employed as the light source of the lamp assembly for car use.

In the lamp assembly for car use, a light distribution pattern stipulated by the standard is obtained by using reflectors and lenses in front of an emitting plane of the lamp assembly so as to project the emitting plane on an appropriate position.

Figure 13:
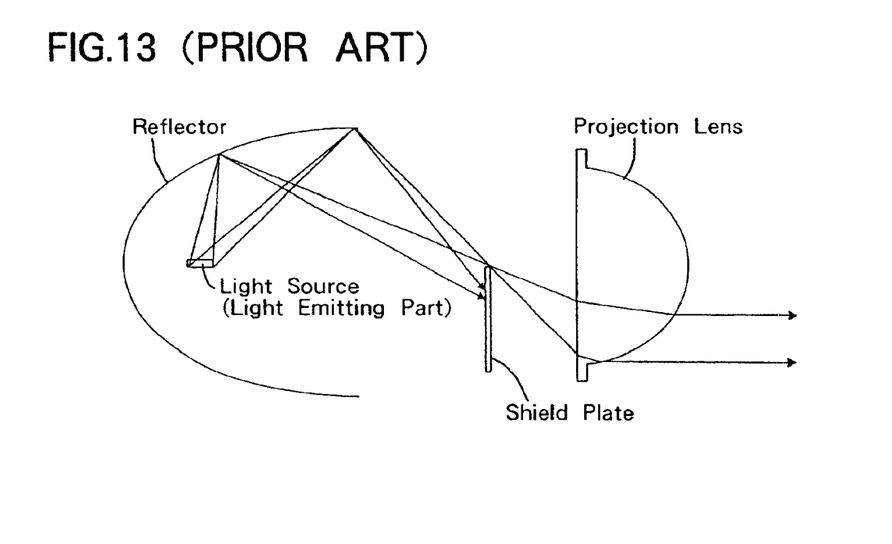
FIG. 13 is a schematic view illustrating a constitution of an ordinary headlight optical system.
Figure 14:
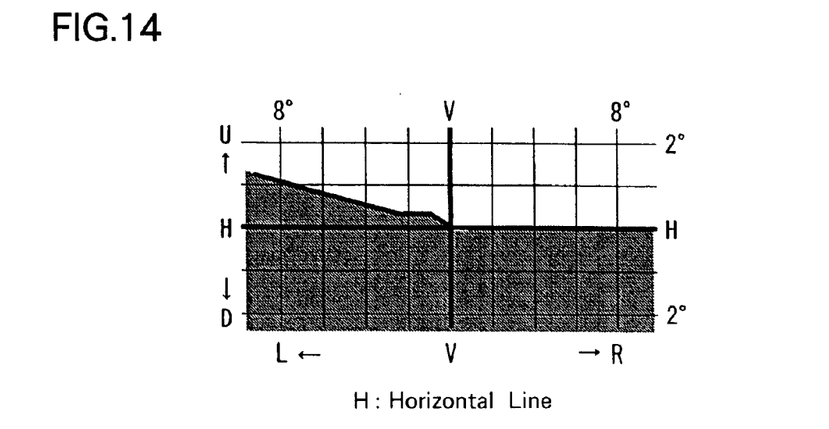

In the presently available lamp assemblies, which employ halogen bulbs and discharge lamps, the light distribution pattern is controlled by a combination of two optical systems, a reflector and a projection lens as shown in FIG. 13. FIG. 14 shows a schematic light distribution pattern (for keep to left countries) of a passing-by lamp beam, which is required to show a sharp contrast (hereinafter referred as "cut-off"). Namely, light does not reach to an upper area than an approximately horizontal line so that light from a headlight of a car does not dazzle a driver of a passing-by car. In the example illustrated in FIG. 13, the cut-off is realized by inserting a shield plate between a light source and the projection lens.

However, the following drawbacks are accompanied, when the optical system illustrated in FIG. 13 is employed.

1) The number of required parts is increased because of the complicated optical system.

2) Since a deep space is required for the lamp assembly, it is hard to modify the lamp assembly into a compact one.

3) When the LED is employed as a light source with less luminous than a conventional light source (a halogen bulb or HID), it is hard to obtain a required maximum luminosity for the headlight of the car, since an enlarged light source image is projected by a reflector.

4) Luminosity of the lamp assembly is lost through reflection by the reflector, refraction by the lens and shielding by the shield plate.

Figure 15:
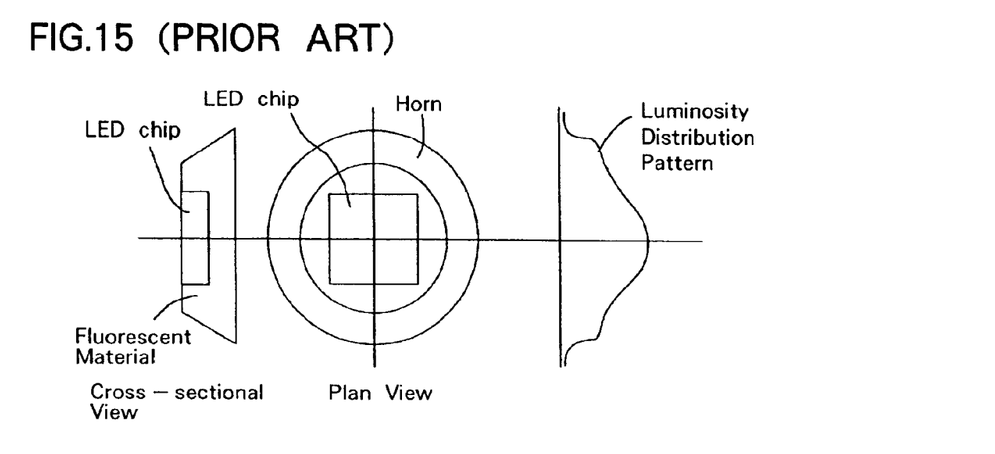
FIG. 15 is schematic view illustrating a luminance distribution pattern of an LED having a conventionally formed cavity.
Figure 16:
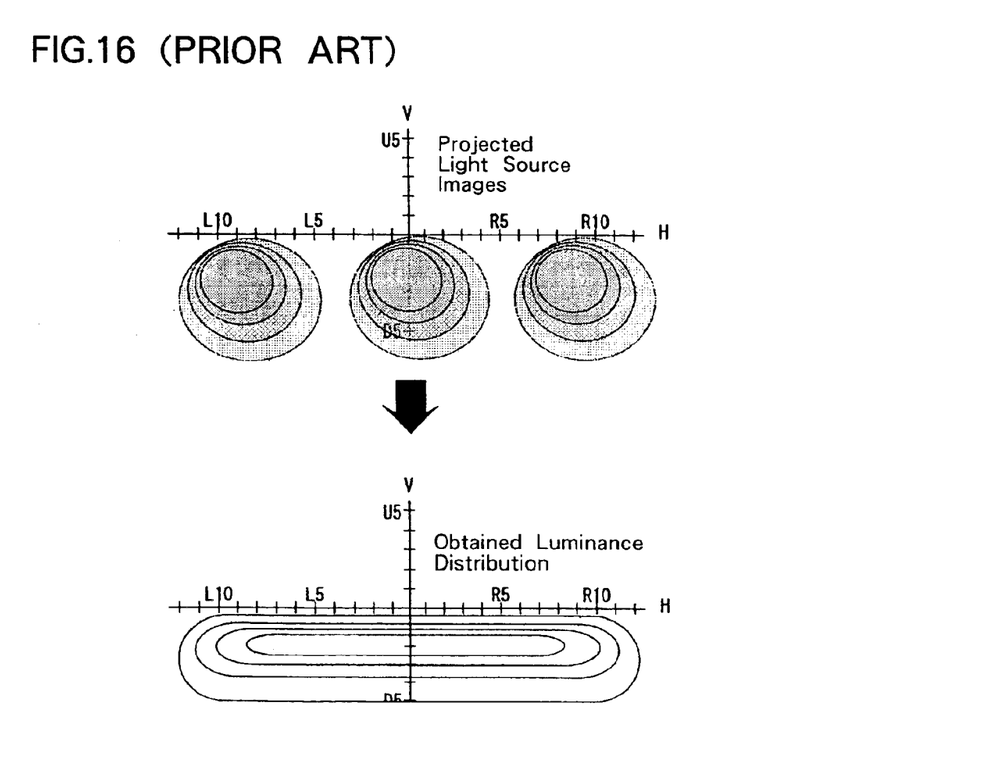
FIG. 16 is a schematic view illustrating luminosity distributing pattern, when the LED shown in FIG. 15 is employed in a headlight.

When the conventional white LED is employed and emitted light is controlled by a reflector only so as to attain a compact lamp assembly, portions a little bit lower than the horizontal line, have maximum luminance as illustrated in FIG. 16, because a center portion of the LED chip has maximum luminosity as illustrated in FIG. 15. Consequently, the required sharp cut-off can not be realized by the conventional white LED.

Recent technical innovations make a GaN type blue LED available by utilizing conductive substrates such as SiC, GaN, Si and the like. When the conductive substrate is applied to the blue LED for the lamp assembly for car use, one surface of the substrate is connected to a cavity of a base by a conductive adhesive and other surface is electrically connected to a lead frame via a wire made of Au or the like, which extends from an electrode arranged in the center of the other surface. Since the above-mentioned extending wire made of Au or the like is projected ahead together with a light emitting surface of the light source of the light assembly for car use, a good light distributing pattern can not be obtained.

SUMMARY OF THE INVENTION

The present invention is carried out in view of the above-mentioned problems in order to obtain a wavelength conversion element for car use, which can be provided as a practically employable part for LED lamps, LED fog lamps and the like.

The above-mentioned problems are solved by inventions constituted as follows.

1) A wavelength conversion element for car use comprising: a heat conductive base having a cavity; one or more chips fitted to the cavity; and a wavelength conversion part, which converts a portion of or the total emitted light from the chips, to visible rays, arranged above the chip; wherein: the chip is light emitting semiconductor and comprises at least one active layer which can emit UV or blue light; the chip has at least one straight side in its plan view; an angle $\Theta_2$ formed between the bottom and the side surface of the cavity is more than 0° less than 90°; the cavity has at least one straight side in its opening; and a ratio of the opening of the cavity to the total of areas of the respective chips in the plan view, is set less than three.

2) The wavelength conversion element for car use according to (1), wherein: a light extracting part having a refractive index between that of the substrate and that of the wavelength conversion part, is formed at the opening side of the cavity.

3) The wavelength conversion element for car use according to (1), wherein: the base having the cavity has at least one straight side.

4) The wavelength conversion element for car use according to (1), wherein: a shape of the chip and a horn shape of the cavity in their plan view are formed in pallarelograms including a square and a rectangle.

5) The wavelength conversion element for car use according to (4), wherein: the length of the chip is different from the width of the chip.

6) The wavelength conversion element for car use according to (1) or (5), wherein: the chip is a junction down type chip including a flip chip type chip; and an electrode arranged on the bottom of the cavity has a high reflective electrode containing either one of Al, Ag, Rh or Pt.

7) The wavelength conversion element for car use according to either one of (1), (5) or (6), wherein: portions of one or more of the chip, the substrate and the light extracting part are coated with a high reflective film.

8) The wavelength conversion element for car use according to either one of (1), (5) to (7), wherein: portions of one or more of the chip, the substrate and the light extracting part are inclined to the opening of the cavity by an acute angle of $\Theta_1$; inert gas is filled around the chip; and the wavelength conversion part is formed at the opening side of the cavity.

9) The wavelength conversion element for car use according to (2), wherein: a thickness d of the light extracting part is determined by the following equation: $d=[(\lambda/4)+m(\lambda/2)]/n$ ($\lambda$: a wavelength of the emitted light, n: a refractive index of said light extracting part, m: an integer).

10) The wavelength conversion element for car use according to either one (1), (5) to (8), wherein: the chip employing a conductive substrate is fitted to the base by a junction down type junction; the electrode arranged on the bottom of the cavity has the high reflective electrode containing either one of Al, Ag, Rh or Pt; and an electrode at the cavity opening side is arranged outside of the center portion of the wavelength conversion element.

11) The wavelength conversion element for car use according to either one of (1), (2), (5) to (8), wherein: the chip employing the conductive substrate is fitted to the base by the junction down type junction; the electrode arranged on the bottom of the cavity has the high reflective electrode containing either one of Al, Ag, Rh or Pt; the light extracting part, which employs a conductive material, is formed on the substrate; and an electrode formed on the light extracting part is arranged outside of the center portion of the wavelength conversion element so as to control an effect caused by a projected shadow of a conductive wire which is formed on the electrode formed on the light extracting part.

BRIEF DESCRIPTION OF THE DRAWINGS

FIGS. 1A and 1B are enlarged schematic views illustrating a basic constitution of a wavelength conversion element for car use by the present invention.

FIGS. 3A and 3B are schematic views illustrating a constitution of a wavelength conversion element by embodiment 1.

FIGS. 4A and 4B are schematic views illustrating constitution of a conventional wavelength conversion element in order to compare with embodiment 1.

FIGS. 5A and 5B are schematic views illustrating constitution of a wavelength conversion element by embodiment 2 where the side surface of a cavity is formed upright.

FIGS. 6A and 6B are schematic views illustrating a constitution of a wavelength conversion element by embodiment 2 where the side surface of a cavity is formed inclined.

FIGS. 7A and 7B are schematic views illustrating a constitution of a wavelength conversion element by embodiment 3 having no light extracting parts.

FIGS. 8A and 8B are schematic views illustrating a constitution of a wavelength conversion element by embodiment 3 having a light extracting part.

FIGS. 9A and 9B are schematic views illustrating a constitution of a wavelength conversion element by embodiment 4.

FIGS. 11A and 11B are schematic views illustrating a constitution of a wavelength conversion element by another embodiment.

FIG. 14 is a schematic light distribution pattern (for keep to left countries) of a headlight beam during passing-by.

DETAILED DESCRIPTION OF THE PREFERRED EMBODIMENTS

Figure 1A:
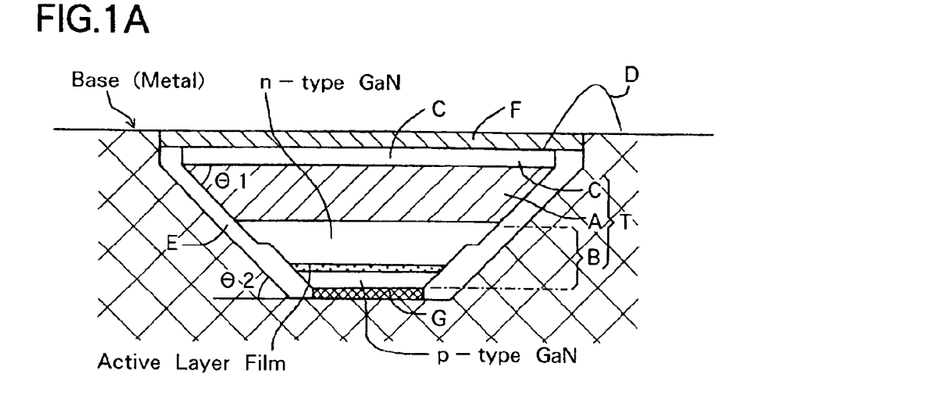
FIG. 1A is a cross-sectional view and FIG. 1B is a plan view.
Figure 1B:
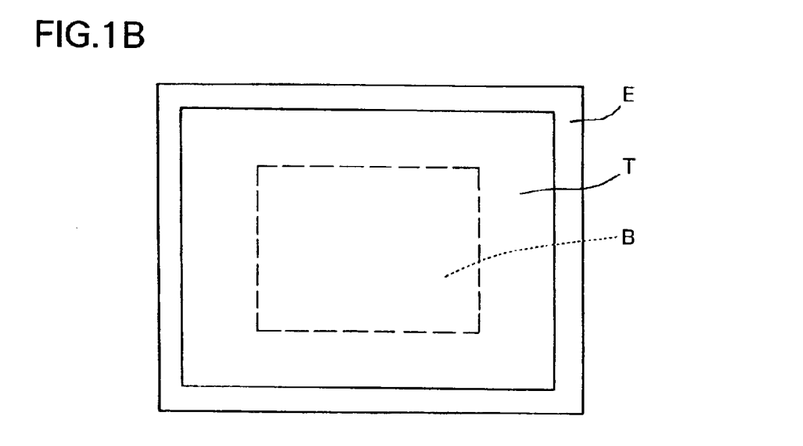

Before getting into embodiments by the present invention, a basic constitution of the wavelength conversion element by the present invention is explained as referring to FIG. 1.

The present invention proposes constitutions of the wavelength conversion elements (chips) for converging light irradiated from side surfaces of the chips along optical axe of the chips efficiently and constitutions for suppressing shadows of conductive wires made of Au or the like from being projected ahead.

A chip T is fitted to a bottom surface of a cavity E formed in a heat conductive base such as Cu or the like. Any materials for forming the chip T can be employed, as far as blue light or ultra-violet light emitted from the materials in the chip T is converted into visible light by fluorescent materials in the chip T. For example, the chip T is obtained in the following manner such that a light emitting part B constituted by an n-type GaN film, an active layer and a p-type GaN film successively grown, is formed on a substrate A. In this case, various materials can be employed as the substrate A, as far as the GaN film can be formed thereon. In order to enhance a light emitting efficiency of the chip T, the light emitting part B should be arranged closer to the base than the substrate A, namely a junction down chip arrangement should be selected, so that heat generated from the chip T is efficiently removed. For that purpose, it is desirable to employ the substrate A having a transparent property against emitted light from the active layer. When GaN compound semiconductors are employed as excitation light sources, SiC and GaN substrates are thought to be optimal as the substrate A, since the present invention also considers a method for fabricating side surfaces of the substrate A so as to converge emitted light along the optical axis of the chip. In the junction down type chip, electrodes are usually arranged on upper and lower surfaces of the chip T, when the substrate A and a layered light extracting part C are made of conductive materials. Alternatively, a flip chip type structure where both p and n electrodes are formed on the same plane, can be employed.

Figure 2:
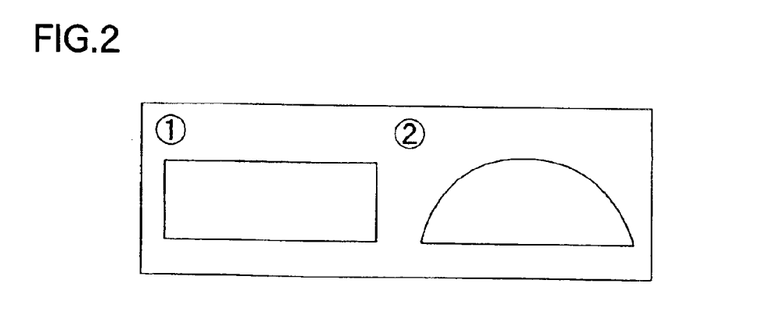
FIG. 2 is a plan view illustrating symmetric shaped cavities.

Any shaped chip is acceptable as far as the chip T includes a straight line in its plan view as illustrated examples ① and ② in FIG. 2. Parallelograms including a square and a rectangle are practical shapes for the chip, when a manufacturing cost of the chip is taken into consideration. Since the light distributing pattern of the headlight shows an elongated shape in the horizontal direction, a rectangular shape is preferable. When conductive substrates made of SiC, GaN and the like are employed as the substrate A, sometimes electrodes are arranged on the upper and lower surfaces of the chip so as to reduce assembling steps of the lamp assembly. If the electrode is arranged at the center area of the upper surface of the chip, a shadow of a connected Au wire to the upper electrode is projected on the road, so that a good light distributing pattern cannot be obtained. Therefore, when a flip chip type connection is not employed, the upper electrode at an opening side of the cavity E should not be arranged at the center area, but should be arranged at areas as illustrated in FIG. 1 so that a shadow of an Au wire is not projected on the road. When a conductive material is employed in the light extracting part C (which is explained below) together with the conductive substrate A, the upper electrode should not be arranged at the center area of the light extracting part C, but should be arranged at areas where the shadow of the Au wire is not projected on the road.

Since light emitted from the side surface of the chip is scarcely utilized for distributed light by the lamp assembly up to now, it is desirable to control the light emitted from the side surface of the chip so as to be utilized effectively when the chip is employed as a wavelength conversion element for car use. The following method is one of the ways to control the light emitted from the side surface of the chip. When the side surface of the wavelength conversion element including the substrate A is coated with Ag, Al, electrode containing highly reflective materials such as an optical thin film etc. or a reflective film, excitation light is converged to a wavelength conversion part F. Hereinafter, an alternative controlling method is described. In view of the fact that GaN and SiC employed as the substrate A have refractive index of more than 2.5, inert gas having a lower refractive index such as $N_2$ gas is filled around the chip instead of a fluorescent material constituted by a resin or the like so that a difference between two refractive indexes is raised. As a result a critical angle is lowered so that a total reflection is caused more easily. Thus, when a substrate side angle $\Theta_1$ formed between a plane formed by the opening of the cavity E and the side surface of the substrate A is set less than 90°, the cavity E functions as a reflective horn which transmits light toward the substrate A. Taking the function of the reflective horn into consideration, most optimal substrate side angle $\Theta_1$ should be set between 30° to 60° in order to transmit excitation light to the substrate A effectively. When the substrate A is diced with a diamond blade having a inclined plane, an inclined side surface can be formed on the substrate A. In order to enhance light extracting efficiency more, a high reflective electrode G may be formed as a film at the bottom of the light emitting part B after the side surface of the chip A is formed in the inclined state. When the light emitting part B and/or of the light extracting part C are diced so as to have inclined surfaces, as well as the substrate A, light extracting efficiency is enhanced further more.

In a junction-down type chip, the high reflective electrode G may be formed on a p-type layer consisting of the top layer of the light emitting part B. The high reflective electrode G can be connected to the p-type layer electrically and a reflective rate of a connected portion to the p-type layer is more than 50%. It usually contains Ag, Pt, Rh and the like. Sometimes the high reflective electrode G may be formed on a soldering material containing either one of In, Ag or Sn, which fixes the chip T to the base, or may be formed on an electrode constituted by an eutectic agent represented by Au/Sn which is formed on the p-type layer. In a non junction-down chip, a translucent Ni/Au electrode and the like is usually employed as a p-type electrode.

The light extracting part C may be arranged at the opposite side of the substrate A to the light emitting part B so as to extract excitation light from the substrate A in the axial direction efficiently. Any stable material having a refractive index between that of the light emitting part B and that of the wavelength conversion part F, can be employed as the light extracting part C. For example, ITO, ZnO and the like are employable. Since sometimes a light extracting efficiency may be deteriorated by interference, it is desirable to determine a thickness "d" of the layered light extracting part C as follows: $d=[(\lambda/4)+m(\lambda/2)]/n$ ($\lambda$: a wavelength of the emitted light, n: a refractive index of the light extracting part C, m: an integer).

It is necessary to form the wavelength conversion part F around the chip for converting a portion of the emitted light from the chip into other wavelengths so as to obtain white light constituted by transmitted emitted light from the chip and emitted light from the wavelength conversion part F or constituted by emitted light from the wavelength conversion part F. Although any special materials are not specified as the wavelength conversion material, YAG type fluorescent materials are employed when wavelengths of a light source to excite fall into a blue region. When the wavelengths of the light source fall into a shorter region than the blue region, trichromatic mixed fluorescent materials for UV light are employed as the wavelength conversion material.

The wavelength conversion part F may be arranged in the whole cavity E or in the upper part of the cavity E as illustrated in FIG. 1. One of the methods of arranging the wavelength conversion part F in the upper part of the cavity E is carried out in the following manner. A fluorescent material capable of converting emitted light from the chip is mixed in a resin such as a silicon resin and mixed resin is precipitated on the upper part of the chip T before the mixed resin is cured. Alternatively, a resin containing the fluorescent material may be applied to the upper part of the chip.

It is necessary to take measures to enhance a luminous emittance of the chip by reducing the size of the cavity E as small as possible without reducing the light extracting rate. The cavity E with any shape is acceptable, as far as the emitted light from the side surfaces of the light emitting part B is transmitted to the wavelength conversion part F. But the opening of the cavity E should have at least one straight side in its plan view. When the area of the opening of the cavity E is less than 3 times of the projected area of the chip T on its plan view, the luminous emittance is enhanced. However it is optimal to set the area of the opening less than 2 times.

The basic arrangement of the wavelength conversion element constituted by one chip T as the LED is explained to this point, but it is also applicable to a multi-chip constituted by a plurality of the chip.

An angle $\Theta_2$ formed by the bottom of the cavity E and the side surface of the cavity E can be set any angle between 0° and 90°, as far the size of the opening is set within the above-mentioned conditions. It is desirable to form the side surfaces of the cavity E upright from the viewpoints of a manufacturing cost and reliability.

The base including the cavity E should have at least one straight side in its plan view so that the chip is not revolved in an undesirable direction when it is attached to the lamp assembly so as to obtain a desired light distributing pattern.

Figure 17:
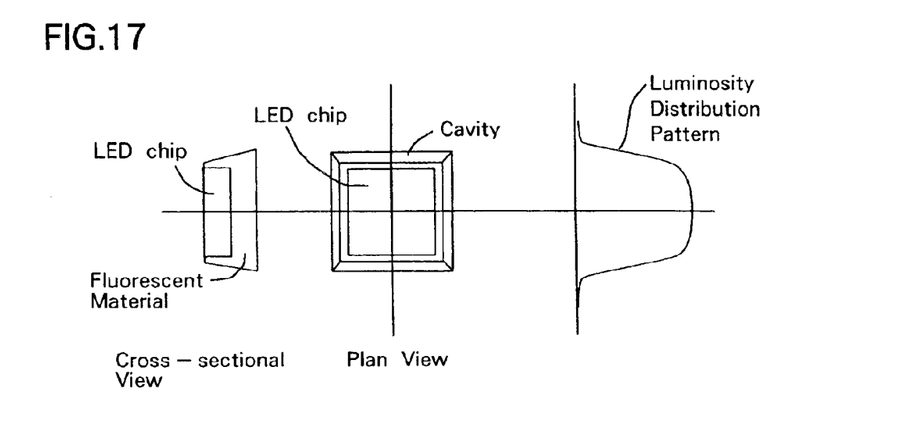
FIG. 17 is schematic view illustrating a luminance distribution pattern of an LED having a cavity by the present invention.
Figure 18:
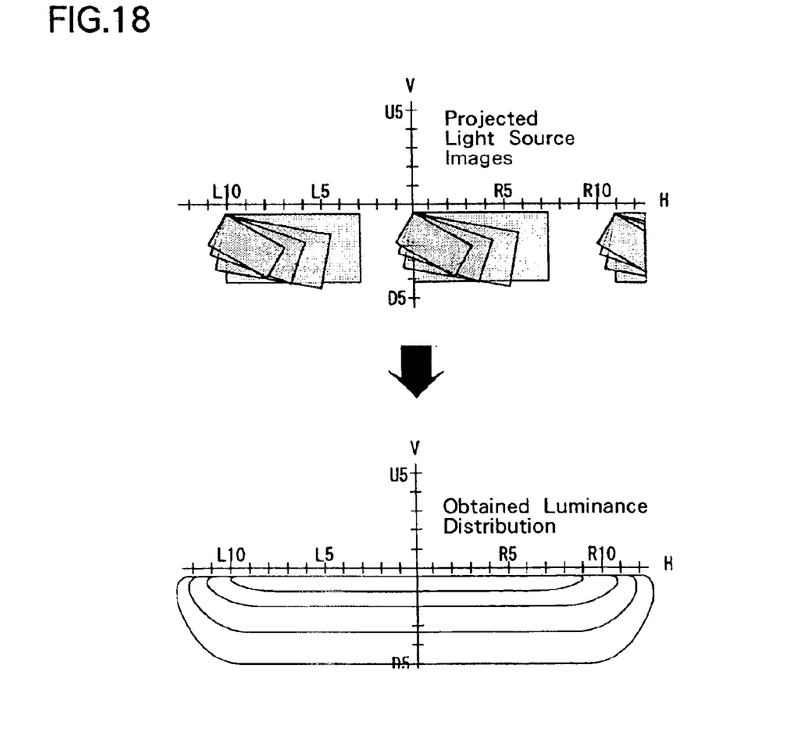
FIG. 18 is a schematic view illustrating luminosity distributing pattern, when the LED shown in FIG. 17 is employed in a headlight.

Hereinafter several embodiments, which are constituted based on the above-mentioned basic arrangement, are explained. The wavelength conversion element for car use by the present invention having a shape as schematically illustrated in FIG. 17, shows higher luminosity over the whole chip, which means light flux is concentrated in a small area, when compared with the conventional chip illustrated in FIG. 15. Consequently, a more distinctive cut-off is attained by the present invention as illustrated in FIG. 18 compared with that of the conventional chip (see FIG. 16).

[Embodiment 1]

Figures 3A, 3B, 4A, 4B:
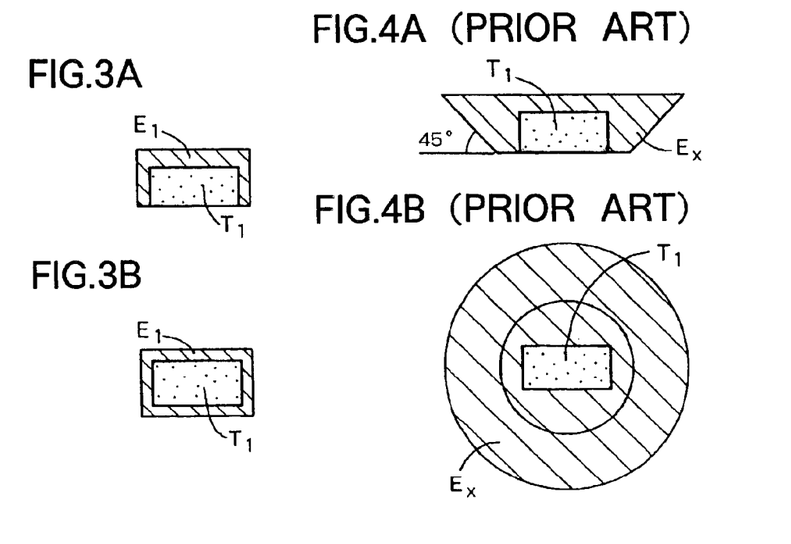
FIG. 3A is a cross-sectional side view and FIG. 3B is a plan view.
FIG. 4A is a cross-sectional side view and FIG. 4B is a plan view.

The present embodiment is explained as referring to FIGS. 3A and 3B.

FIGS. 3A and 3B are schematic views illustrating the constitution of the wavelength conversion element which is applied to the LED lamp for car use. FIG. 3A is the cross-sectional side view and FIG. 3B is the plan view.

An LED device constituted by layered GaN films being grown on a SiC substrate is manufactured as a chip $T_1$. The chip $T_1$ has an area of 1 mm by 2 mm and a height of 0.3 mm and emits excitation light with a wavelength of 470 nm. The flip chip type junction is selected for the present chip. A silicon resin mixed with a YAG:Ce fluorescent is filled in a cavity $E_1$ so as to obtain white light, of which color coordinates are as follows: X=0.31 and Y=0.32.

The cavity $E_1$ of the chip $T_1$ illustrated in FIGS. 3A and 3B by the present invention has a bottom of 1.1 mm by 2.1 mm and an angle between the side surface of the cavity and the bottom is formed upright.

In order to compare performances between the present chip and the conventional chip, the conventional typed chip, in which a resin with the same composition as the above-mentioned chip $T_1$ is employed. FIGS. 4A and 4B are schematic views illustrating the conventional chip. FIG. 4A is the cross-sectional side view and FIG. 4B is the plan view.

As illustrated in FIGS. 4A and 4B, a cavity Ex of the conventional chip has a circular bottom with a diameter of 3.0 mm and a side surface with an inclined angle of 45°.

Performances of the lamps for car use constituted by the above-mentioned chips are compared. Performance data measured without attaching a lens to the lamp assembly are shown in TAB.1.

TABLE 1

|  | Conventional LED (FIGs. 4A, 4B) | Embodiment 1 (FIGs. 3A, 3B) |
| --- | --- | --- |
| Luminous Flux | 36.4 lm | 30.5 lm |
| Area of Cavity Opening | 12.6 mm$^2$ | 2.3 mm$^2$ |
| Luminous Emittance | 2.89 lm/mm$^2$ | 13.3 lm/mm$^2$ |

As understood through data in TAB.1, the luminous emittance is improved hen the more converging and smaller cavity $E_1$ is employed, so that embodiment 1 is judged to be an excellent wavelength conversion element for car use.

[Embodiment 2]

Figure 5A:
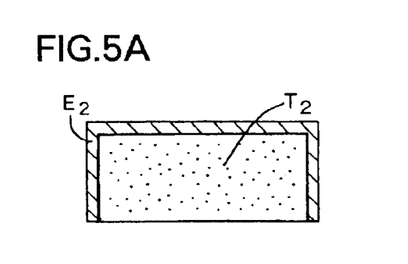
FIG. 5A is a cross-sectional side view and FIG. 5B is a plan view.
Figure 5B:
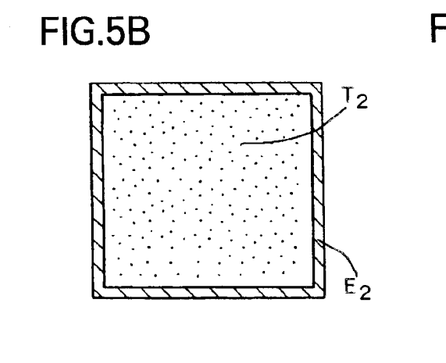
Figure 6A:
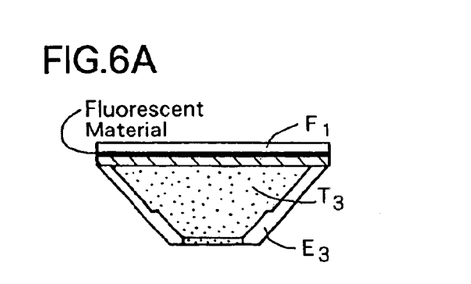
FIG. 6A is a cross-sectional side view and FIG. 6B is a plan view.
Figure 6B:
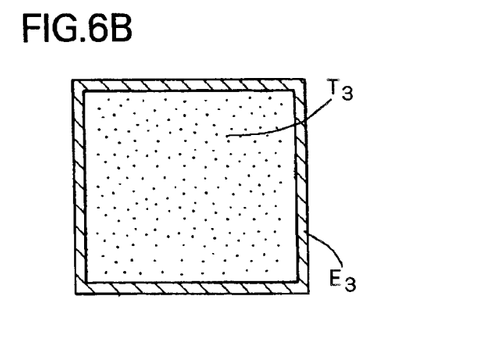

LED devices constituted by layered GaN films being grown on SiC substrates are manufactured as chip $T_2$ illustrated in FIGS. 5A and 5B, and $T_3$ illustrated in FIGS. 6A and 6B. The chips $T_2$ and $T_3$ respectively have an area of 1 mm by 1 mm and a height of 0.3 mm and emit excitation light with a wavelength of 470 nm. The flip chip type junctions are selected for both chips. The side surface of the chip $T_2$ is formed upright and the whole side surfaces of the chip are inclined 45° in relation to the bottom of the chip $T_3$. The cavity $E_2$ illustrated in FIGS. 5A and 5B has a bottom of 1.1 mm by 1.1 mm and the cavity $E_3$ illustrated in FIGS. 6A and 6B has a bottom of 0.5 mm by 0.5 mm and a cavity opening of 1.1 mm by 1.1 mm. A silicon resin mixed with a YAG:Ce fluorescent material is filled in a cavity $E_2$ of chip $T_2$ illustrated in FIGS. 5A and 5B so as to obtain white light. $N_2$ gas is filled around the chip $T_3$ illustrated in FIGS. 6A and 6B and a quartz glass plate coated with a solution including the same fluorescent material as the chip $T_2$, employed as a wavelength conversion part $F_1$, is applied to the upper portion of the chip $T_3$ such that the coated side of the quartz glass plate is closely contacted to the chip $T_3$. A thickness or concentration of the fluorescent material is adjusted so as to obtain color coordinates: X=0.32 and Y=0.31 in both chips $T_2$ and $T_3$. Performances of the chips $T_2$ and $T_3$ are measured without attaching a lens to the lamp assembly and obtained data are shown in TAB.2.

TABLE 2

|  | Upright sided chip (FIGs. 5A, 5B) | Inclined sided chip (FIGs. 6A, 6B) |
| --- | --- | --- |
| Luminous Flux | 17.2 lm | 21.6 lm |
| Area of Cavity Opening | 1.2 mm$^2$ | 1.2 mm$^2$ |
| Luminous Emittance | 14.3 lm/mm$^2$ | 18.0 lm/mm$^2$ |

Comparing data in TAB.2, it is confirmed that the luminous emittance is improved, when the side surface of the chip $T_3$ is inclined and $N_2$ gas is filled around the cavity $E_3$.

[Embodiment 3]

Figure 7A:
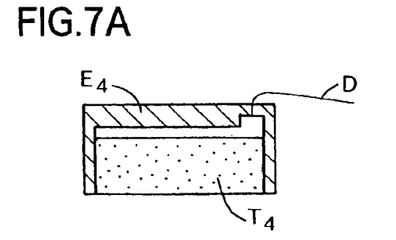
FIG. 7A is a cross-sectional side view and FIG. 7B is a plan view.
Figure 7B:
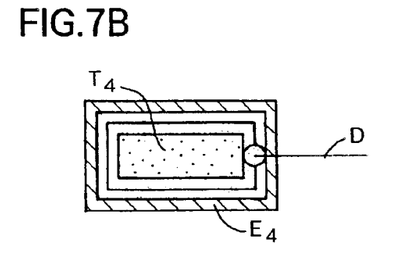
Figure 8A:
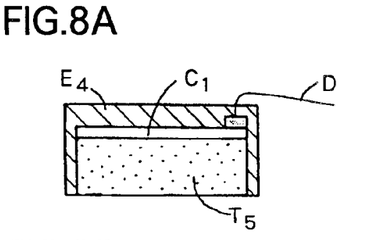
FIG. 8A is a cross-sectional side view and FIG. 8B is a plan view.
Figure 8B:
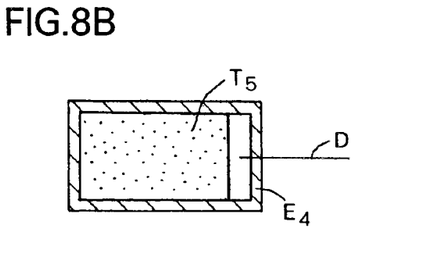

LED devices constituted by layered GaN films being grown on SiC substrates are manufactured as chip $T_4$ illustrated in FIGS. 7A and 7B, and $T_5$ illustrated in FIGS. 8A and 8B. The chips $T_4$ and $T_5$ respectively have an area of 1 mm by 2 mm and a height of 0.3 mm and emit excitation light with a wavelength of 470 nm. The junction down type junctions are selected for both chips. The side surfaces of the cavities of the chip $T_4$ and $T_5$ are formed upright. Both cavities $E_4$ and $E_4$ respectively have a bottom of 1.1 mm by 2.1 mm. The light extracting part is not employed in the chip $T_4$ illustrated in FIGS. 7A and 7B. A light extracting part $C_1$ made of ITO, which also functions as a current diffusing layer, is formed on the hip $T_5$ illustrated in FIG. 8A. A silicon resin mixed with a YAG:Ce fluorescent material is filled in both cavities $E_4$ and $E_4$ so as to obtain white light.

A thickness or concentration of the fluorescent material is adjusted so as to obtain color coordinates: X=0.32 and Y=0.31 in both chips $T_4$ and $T_5$. Performances of the chips $T_4$ and $T_5$ are measured without attaching a lens to the lamp assembly and obtained data are shown in TAB.3.

TABLE 3

|  | No light extracting part (FIGs. 7A, 7B) | With light extracting part (FIGs. 8A, 8B) |
|---|---|---|
| Luminous Flux | 30.2 lm | 35.2 lm |
| Area of Cavity Opening | 2.3 mm² | 2.3 mm² |
| Luminous Emittance | 13.1 lm/mm² | 15.3 lm/mm² |

From data in TAB.3, it is confirmed that the luminous emittance is improved by the light extracting part $C_1$.

[Embodiment 4]

Figure 9A:
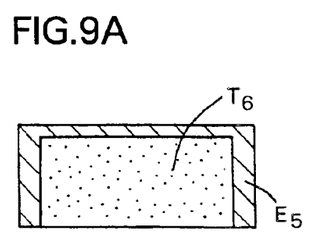
FIG. 9A is a cross-sectional side view and FIG. 9B is a plan view.
Figure 9B:
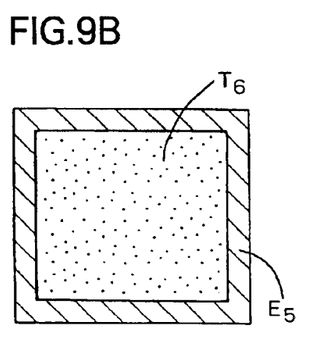

An LED device constituted by layered GaN films being grown on a SiC substrate is manufactured as chip $T_6$ illustrated in FIGS. 9A and 9B. The chip $T_6$ has an area of 1 mm by 1 mm and a height of 0.3 mm and emit excitation light with a wavelength of 470 nm. The junction down type junction is selected for the present chip. The side surface of the cavity of the chip $T_6$ is formed upright. A cavity $E_5$ has a bottom of 1.2 mm by 1.2 mm. The light extracting part is not arranged in the chip $T_6$. A silicon resin mixed with a YAG:Ce fluorescent material is filled in the cavity $E_5$ so as to obtain white light. A thickness or concentration of the fluorescent material is adjusted so as to obtain color coordinates: X=0.32 and Y=0.31 in the chips $T_6$. A Performance of the chip $T_6$ is measured without attaching a lens to the lamp assembly and obtained data is shown in TAB.4.

TABLE 4

|  | Upright sided chip (FIGs. 9A, 9B) |
|---|---|
| Luminous Flux | 16.1 lm |
| Area of Cavity Opening | 1.44 mm² |
| Luminous Emittance | 11.2 lm/mm² |

From data in TAB.4, it is confirmed that the enough luminous emittance is obtained even when the side surface of chip is not formed inclined.

Figure 10:
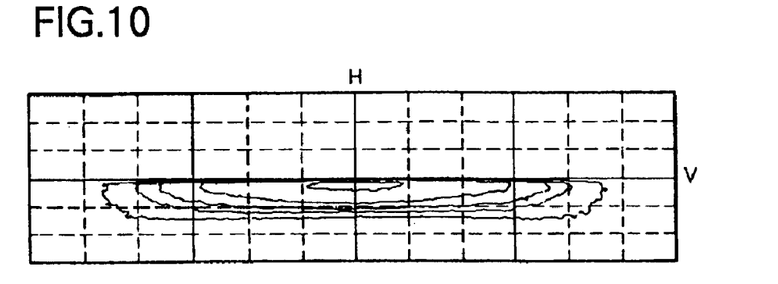
FIG. 10 is a chart showing a simulated light distributing pattern when 16 wavelength conversion elements by embodiment 4 are employed in a headlight.

A light distribution pattern illustrated in FIG. 10 is obtained by a simulation carried out in the following manner: a lamp assembly of a headlight for car use, which employs 16 chips illustrated in FIGS. 9A and 9B and an optimized reflector, is supposed to irradiate a light beam ahead. From the light distribution pattern in FIG. 10 it is confirmed that a clear cut off is realized when the present chips are employed in the lamp assembly.

[Embodiment 5]

Figure 11A:
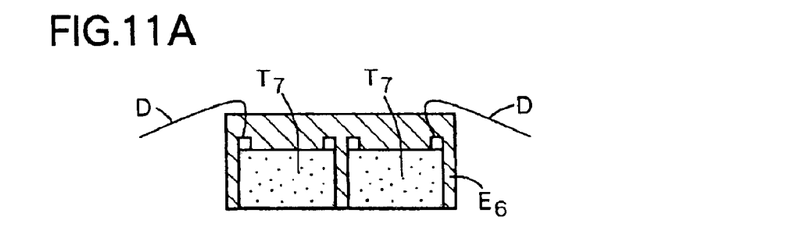
FIG. 11A is a cross-sectional side view and FIG. 11B is a plan view.
Figure 11B:
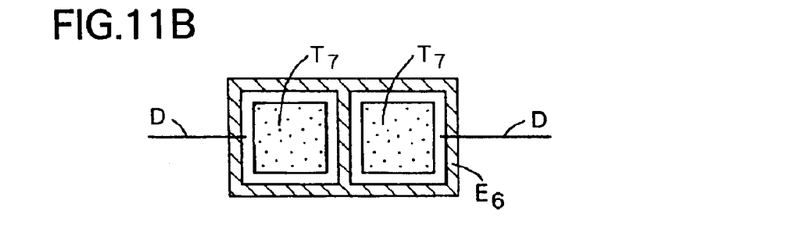

FIGS. 11A and 11B is an example of LED lamps for car use in which chips are arranged.

An LED device is arranged as a multi-type chip consisting of two chips $T_7$ mounted on a base. Each chip is constituted by layered GaN films being grown on a SiC substrate. The chip $T_7$ has an area of 0.9 mm by 0.9 mm and a height of 0.3 mm and emit excitation light with a wavelength of 470 nm. The junction down type junctions are selected for the present chips. The side surface of the cavity of the chip $T_7$ is formed upright. A cavity $E_6$ has a bottom of 1.1 mm by 2.1 mm. Two chips $T_7$ are arranged in the cavity $E_6$ where distances between the chip $T_7$ and the side surface of the cavity $E_6$, and a distance between two chips $T_7$ are arranged at 100 μm.

A silicon resin mixed with a YAG:Ce fluorescent material is filled in the cavity $E_6$ so as to obtain white light. A thickness or concentration of the fluorescent material (not illustrated in FIGS. 11A and 11B) is adjusted so as to obtain color coordinates: X=0.32 and Y=0.31. A performance of the LED device illustrated in FIGS. 11A and 11B is measured without attaching a lens to the lamp assembly and obtained data is shown in TAB.5.

TABLE 5

|  | Multi-type chip (FIGs. 11A, 11B) |
|---|---|
| Luminous Flux | 28.2 lm |
| (1) Area of Cavity Opening | (3) 2.3 mm² |
| (2) |  |
| (4) Luminous Emittance | (5) 12.3 lm/mm² |

From data in TAB.5, it is confirmed that the enough luminous emittance is obtained by employing the multi-type chip. This implies that the LED device can be employed as a light source of the headlight for car use, since the enough luminous emittance and a light intensity for the headlight is realized by employing a plurality of LED devices.

As explained above, since light irradiated from the side surfaces of the chip is diverged in the chip as a light beam and shadows of conductive wires such as Au wires can be prevented from projecting ahead, the present invention can provide chips as practical products employable in LED headlights and LED fog lamps. Since some of the side surfaces of the chips and the cavities by the present invention are formed in a straight line, a headlight of a car can be formed such that irradiated light from the headlight is prevented from reaching to a driver in the opposite lane. Although the area of the cavity opening is set less than two times of the maximum area of the light emitting part, a sufficient luminous flux diverging rate can be obtained. In addition, since the angle $\Theta_2$ between the bottom of the cavity and the side surface of the cavity can be set in a range of more than 0° and less than 90°, various types of LED devices for car use can be provided.

Further, since the base of the LED device by the present invention has at least one straight portion, the LED device as a light source is attached to the lamp assembly by its strait portion, the cavity is not fitted at a wrong angle to the lamp assembly. Therefore the straight portion of the base has an effect to prevent from obtaining an undesired light distribution pattern due to a deviation in the attached angle of the base of the LED device to the lamp assembly.

What is claimed is:

1. A wavelength conversion element for car use comprising:
    a heat conductive base having a cavity having an opening and a bottom surface and a side surface forming an angle $\Theta_2$ therebetween;
    at least one chip fitted to said cavity, said at least one chip for emitting light; and
    a wavelength conversion part, which converts a portion of or the total emitted light from said at least one chip, to visible rays, arranged adjacent to said at least one chip;
    wherein:
    said at least one chip is a light emitting semiconductor and comprises at least one active layer which emits UV or blue light;
    said at least one chip has at least one straight side in its plan view;
    said angle $\Theta_2$ formed between the bottom and the side surface of said cavity is more than 0° and less than 90°;

said cavity having at least one straight side at the opening; and a ratio of the opening area of said cavity to the total of the areas of said at least one chip in the plan view, is less than three.

2. The wavelength conversion element for car use according to claim 1, wherein: said wavelength conversion part has a refractive index, said at least one chip comprises a substrate having a refractive index, and including a light extracting part having a refractive index between that of said substrate and that of said wavelength conversion part, is formed at the opening side of said cavity.

3. The wavelength conversion element for car use according to claim 1, wherein: said base having said cavity has at least one straight side.

4. The wavelength conversion element for car use according to claim 1, wherein:
   a shape of said chip and a shape of said cavity in their plan view are formed as parallelograms.

5. The wavelength conversion element for car use according to claim 4, wherein:
   the at least one chip has a length and a width, the length of said at least one chip is different from the width of said at least one chip.

6. The wavelength conversion element for car use according to claim 1 or claim 5, wherein:
   said chip is a junction down chip including a flip chip; and
   a highly reflective electrode arranged on the bottom of the cavity containing either one of Al, Ag, Rh or Pt.

7. The wavelength conversion element for car use according to either one of claims 1 and 5 wherein:
   said chip includes a substrate, further including a light extracting part, portions of one or more of said at least one chip, said substrate and said light extracting part are coated with a high reflective film.

8. The wavelength conversion element for car use according to claim 7, wherein:
   portions of one or more of said at least one chip, said substrate and said light extracting part are inclined to the opening of said cavity by an acute angle of $\Theta_1$;
   inert gas is filled around said chip; and
   said wavelength conversion part is formed at the opening side of said cavity.

9. The wavelength conversion element for car use according to claim 2, wherein:
   the light extracting part has a thickness d which is determined by the following equation: $d=[(\lambda/4)+m(\lambda/2)]/n$ ($\lambda$: a wavelength of the emitted light, n: a refractive index of said light extracting part, m: an integer).

10. The wavelength conversion element for car use according to either one of claims 1 and 5 wherein:
    said at least one chip employs a conductive substrate fitted to said base by a down junction;
    further including an electrode arranged on the bottom of said cavity having a highly reflective electrode containing either one of Al, Ag, Rh or Pt; and
    further including an electrode at the cavity opening side arranged outside of the center portion of said wavelength conversion element.

11. The wavelength conversion element for car use according to either one of claims 1, 2, and 5, wherein:
    said at least one chip including a conductive substrate fitted to said base by a down junction;
    further including a highly reflective electrode arranged on the bottom of said cavity containing either one of Al, Ag, Rh or Pt;
    and further including a light extracting part, which employs a conductive material, is formed on said substrate; and
    an electrode formed on said light extracting part being arranged outside of the center portion of said wavelength conversion element so as to control an effect caused by a projected shadow of a conductive wire which is formed on said electrode formed on said light extracting part.

12. The wavelength conversion element for car use according to claim 6 wherein said chip includes a substrate, further including a light extracting part, portions of one or more of said at least one chip, said substrate and said light extracting part being coated with a high reflective film.

13. The wavelength conversion element for car use according to claim 6, including a light extracting part wherein:
    portions of one or more of said at least one chip, said substrate and said light extracting part are inclined to the opening of said cavity by an acute angle of $\Theta_1$;
    inert gas is filled around said chip; and
    said wavelength conversion part is formed at the opening side of said cavity.

14. The wavelength conversion element for car use according to claim 6 wherein:
    said at least one chip includes a conductive substrate fitted to said base by a down junction;
    further including an electrode arranged on the bottom of said cavity having a highly reflective electrode containing either one of Al, Ag, Rh or Pt; and
    further including an electrode at the cavity opening side arranged outside of the center portion of said wavelength conversion element.

15. The wavelength conversion element for car use according to claim 7 wherein:
    said at least one chip includes a conductive substrate fitted to said base by a down junction;
    further including an electrode arranged on the bottom of said cavity having a highly reflective electrode containing either one of Al, Ag, Rh or Pt; and
    further including an electrode at the cavity opening side arranged outside of the center portion of said wavelength conversion element.

16. The wavelength conversion element for car use according to claim 8 wherein:
    said at least one chip includes a conductive substrate fitted to said base by a down junction;
    further including an electrode arranged on the bottom of said cavity having a highly reflective electrode containing either one of Al, Ag, Rh or Pt; and
    further including an electrode at the cavity opening side arranged outside of the center portion of said wavelength conversion element.

17. The wavelength conversion element for car use according to claim 6, wherein:
    said at least one chip includes a conductive substrate fitted to said base by a down junction;
    further including a highly reflective electrode arranged on the bottom of said cavity containing either one of Al, Ag, Rh or Pt;
    and further including a light extracting part, which employs a conductive material, is formed on said substrate; and
    an electrode formed on said light extracting part being arranged outside of the center portion of said wavelength conversion element so as to control an effect caused by a projected shadow of a conductive wire which is formed on said electrode formed on said light extracting part.

18. The wavelength conversion element for car use according to claim 7, wherein:

said at least one chip includes a conductive substrate fitted to said base by a down junction;

further including a highly reflective electrode arranged on the bottom of said cavity containing either one of Al, Ag, Rh or Pt;

and further including a light extracting part, which employs a conductive material, is formed on said substrate; and an electrode formed on said light extracting part being arranged outside of the center portion of said wavelength conversion element so as to control an effect caused by a projected shadow of a conductive wire which is formed on said electrode formed on said light extracting part.

19. The wavelength conversion element for car use according to claim 8, wherein:

said at least one chip includes a conductive substrate fitted to said base by a down junction;

further including a highly reflective electrode arranged on the bottom of said cavity containing either one of Al, Ag, Rh or Pt;

and further including a light extracting part, which employs a conductive material, is formed on said substrate; and an electrode formed on said light extracting part being arranged outside of the center portion of said wavelength conversion element so as to control an effect caused by a projected shadow of a conductive wire which is formed on said electrode formed on said light extracting part.

* * * * *